Sept. 20, 1960 R. R. HEIKES ET AL 2,953,617

THERMOELEMENTS AND DEVICES EMBODYING THEM

Original Filed April 16, 1957

Properties of $Li_{.03}Mn_{.97}Se$

INVENTORS
Robert R. Heikes &
William D. Johnston
BY
Frederick Shapoe
ATTORNEY

United States Patent Office 2,953,617

Patented Sept. 20, 1960

2,953,617

THERMOELEMENTS AND DEVICES EMBODYING THEM

Robert R. Heikes, Wilkinsburg, and William D. Johnston, Pittsburgh, Pa., assignors to Westinghouse Electric Corporation, East Pittsburgh, Pa., a corporation of Pennsylvania Continuation of application Ser. No. 653,245, Apr. 16, 1957. This application Oct. 3, 1958, Ser. No. 765,026

6 Claims. (Cl. 136—5)

Figure 1:
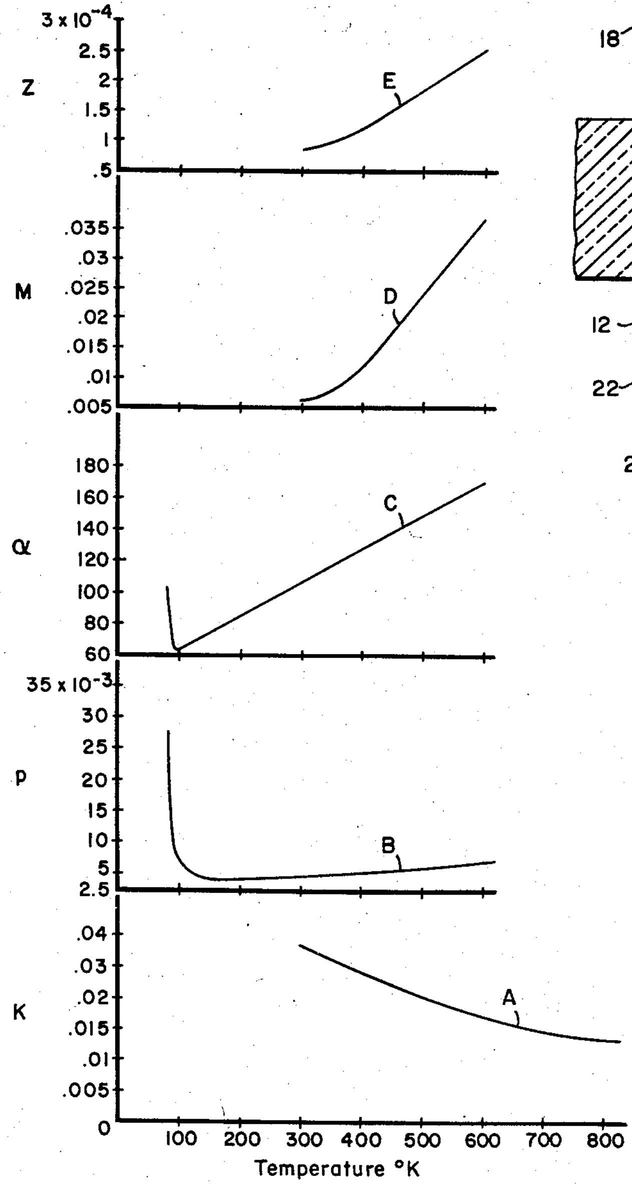

The present invention relates to thermoelements and thermoelectric devices embodying the same.

This application is a continuation of our application Serial No. 653,245, filed April 16, 1957.

It has been regarded as highly desirable to produce thermoelectric devices wherein either an electric current is passed therethrough whereby to provide for cooling applications or alternatively a source of heat is applied to one junction of the thermoelectric device to bring this junction to a given elevated temperature while the other junction is kept at a lower temperature, whereby an electrical voltage is generated in the device. For refrigeration applications in particular, one junction of the thermoelectric device is disposed within an insulated chamber and electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

Previously, available materials for thermoelectric devices have been experimented with extensively. The best possible combinations of materials known heretofore have been inefficient and relatively unsatisfactory for one or more of the following reasons:

(1) The maximum verified temperature drop in the cold junction of the thermoelement is approximately 32.5° C.—such temperature drop is inadequate for most practical refrigeration apparatus. While in the literature there have been made claims for temperature drops of up to 60° C. to 80° C. with individual elements the materials and the structures have not defined.

(2) The efficiency of the thermoelectric device based on the electrical energy supplied thereto is quite low, at best amounting to approximately ¼ of the efficiency obtainable with a common compression refrigeration unit.

The passage of an electrical current through a thermoelectric device results in the absorption of heat at one junction and evolution of heat at the other junction thereof. In addition thereto, the passage of an electrical current through the elements produces Joule heat which is proportional to the second power of the electrical current flowing therethrough. Any heat generated in the thermoelements will flow toward the cold junction as well as toward the hot junction of the thermoelectric device. The electrical resistivity of the thermoelement members of the device and the thermal conductivity should be as small as possible.

Thermoelectric devices may be tested and a number indicating its relative effectiveness, called the "index of efficiency" (which sometimes has been called figure of merit) may be computed from the test data. The higher the index of efficiency the more efficient is the thermoelectric device. The index of efficiency M for a thermoelement member may be defined as follows:

$$M=\frac{T(\pi \cdot T)^2}{4Kp}=\frac{T}{4}\frac{\alpha^2}{Kp} \quad (1)$$

where T is the absolute temperature, $\pi$ is the Peltier coefficient in calories per coulomb for the thermoelement, $p$ is the electrical resistivity, K is the thermal conductivity for the thermoelement member and $\alpha$ is the Seebeck coefficient in volts per ° C. Where two thermoelement members having differing resistances and thermal conductivities and Peltier coefficients are employed in pairs, the index of efficiency of the combination may be computed from the following equation:

$$M=\frac{T(\alpha_1+\alpha_2)^2}{4(\sqrt{p_1k_1}+\sqrt{p_2k_2})^2} \quad (2)$$

in which $p_1$ and $p_2$ are the electrical resistivity of each of the thermoelement members, $\alpha$ is the thermoelectric power in volts per ° C., K is in watts per cm./deg. C., and $p$ is in ohm centimeters.

In some cases, another parameter often employed to describe the merit of a thermoelectric material is the figure of merit, Z as defined by the following equation:

$$Z=\frac{4M}{T}$$

where M is the index of efficiency.

For the best presently available thermoelectric elements for power generation the maximum index of efficiency is approximately 0.05 to 0.1 (5% to 10%) and for the vast majority of thermoelectric elements it is substantially below 0.05. Commercially acceptable thermoelectric elements should have an index of efficiency of M equal to at least 0.1 for the temperatures to be applied to the junctions, and preferably 0.15 and higher. While in substantially all ordinary metals the product of $p$K is reasonably small, V is of the order of 30 microvolts per ° C. and as a consequence the index of efficiency is much less than 0.1 usually being less than 0.01.

This invention is directed to the preparation of mixed valence inorganic compounds having relatively low $p$K coefficients and having a thermoelectric power (often called the Seebeck coefficient) V of the order of 100 to 1000 microvolts per ° C. The electrical resistivity of this material is of the order of $10^{-2}$ ohm centimeters. The thermal conductivity is of the order of 0.02 watt per cm. per degree C.

The object of this invention is to provide thermoelectric devices comprising a thermoelement of which at least one member is a homogeneous solid of a mixed valence transition metal chalcogenide.

A further object of the invention is to provide thermoelectric devices embodying non-stoichiometric inorganic compounds suitable for use in thermoelectric devices having a high index of efficiency or figure of merit.

Another object of the invention is to provide a thermoelectric device in which an inorganic compound forms one element and a metal forms the other element of a thermoelement pair.

A still further object is to provide a thermoelectric device in which one element comprises the sulfide, selenide or telluride of lithium manganese.

Other objects of the invention will in part be obvious and will in part appear hereinafter. For a better understanding of the nature and objects of this invention, reference should be had to the following detailed description and drawing in which Figure 1 comprises graphs plotting temperatures against various properties and Figure 2 is a schematic view partly in cross section of a thermoelectric cooling device.

Highly useful thermoelements are single phase mixed valence compounds having the formula $Li_mT_{(1-m)}X$ where T represents at least one transition metal from the group consisting of manganese, iron, nickel, cobalt, copper and zinc, X represents a chalcogenide from the group consisting of oxygen, sulfur, selenium and tellurium and *m* has a value not exceeding about 0.1 and not less than .001. When X represents oxygen, especially suitable transition metals are copper and nickel. The homogeneous solids of this formula may be employed as the positive element of a thermoelement pair.

A suitable negative element to cooperate with the positive element may be composed of a homogeneous solid having the formula $Al_nT_{(1-n)}X$, where T represents one or more transition metals, X has the value previously given and *n* has a value of from 0.1 to 0.001. A specific composition of this compound has the formula $$Al_nCu_{(1-n-p)}Zn_pO$$

wherein *n* has a value of from 0.1 to 0.001 and *p* has a value not exceeding $(1-n)$.

Other suitable positive and negative thermoelement components may comprise compounds having the formula $MZ_{(1+a)}$ where M represents an element from the group consisting of chromium, iron, nickel, copper, cobalt and manganese and Z represents an element selected from the group consisting of sulfur, selenium, tellurium, arsenic, antimony and bismuth and has a positive value of less than 0.1.

When the compound has the formula $MZ_{(1+a)}$, homogeneous members thereof may function as the positive element. Conversely, when the inorganic compound has the formula $MZ_{(1-a)}$, homogeneous members thereof will function as the negative element. Thermoelement pairs may be prepared by employing members of from each of these groups and joining the terminals of a positive to a negative element. Furthermore members of the compound having the formula $MZ_{(1+a)}$ may be paired with members of the compound having the formula $Al_nT_{(1-n)}X$ to form satisfactory thermoelements. Members of the compound having the formula $MZ_{(1-a)}$ may be paired with members of the compound having formula $Li_mT_{(1-m)}X$ to provide satisfactory thermoelements. It will be understood that all of these inorganic compounds are homogeneous for the purpose of this invention.

It has been discovered that highly satisfactory thermoelements may be prepared by combining a metal member with a member of any of the homogeneous inorganic compounds, either positive or negative elements. Examples of suitable metals are copper, silver, copper base alloys, silver base alloys and molybdenum. Any metal which is solid under conditions of use and non-reactive with the inorganic compound or the atmosphere or surrounding medium can be employed in such thermoelement devices. Copper will give excellent results when associated with a member of the compounds $MZ_{(1+a)}$, $Li_mT_{(1-m)}X$ or $Al_nT_{(1-n)}X$.

Specific potentially useful thermoelement members may be prepared from compounds of chromium or manganese reacted with tellurium, arsenic, antimony and bismuth wherein there is either a slight excess or deficiency of tellurium, arsenic, antimony or bismuth over the metal cation. Examples of compounds of this type are chromium telluride, manganese arsenide, manganese telluride, manganese bismuthide and manganese antimonide. In all cases the anion preferably does not exceed 0.1 mol excess or deficiency. These nonstoichiometric compounds are readily prepared by admixing the manganese or chromium with the desired amount of the anion and firing the mixture within a protected atmosphere. The reaction product may be compressed into a pellet and sintered at elevated temperature to produce a relatively solid member.

The lithium substituted transition metal chalcogenides may be prepared as disclosed in our copending patent application Serial No. 580,856, filed April 26, 1956. Briefly, this comprises preparing a transition metal oxide and then admixing it intimately with lithium peroxide. The intimate mixture compressed into a pellet is placed within a sealed container and heated to a temperature of from 600° C. to 1200° C. for a period of time to produce the desired lithium substituted transition metal compound.

The inorganic compounds $Li_mMn_{(1-m)}Se$, $Li_mMn_{(1-m)}S$ and $Li_mMn_{(1-m)}Te$ where *m* has a value of from 0.001 to 0.11, have proven to have exceptional merit as a thermoelectric element. These respective selenide, sulfide and telluride compounds may be prepared by the following reaction:

$$\frac{m}{2}\,Li_2Se+\frac{m}{2}\,Se+(1-m)\;MnSe\longrightarrow Li_mMn_{(1-m)}Se$$

$$\frac{m}{2}\,Li_2Te+\frac{m}{2}\,Te+(1-m)\;MnTe\longrightarrow Li_mMn_{(1-m)}Te$$

$$\frac{m}{2}\,Li_2S+\frac{m}{2}\,S+(1-m)\,MnS\longrightarrow Li_mMn_{(1-m)}S$$

where *m* has the value of from 0.001 to 0.11. The upper limit value for *x* is the point where a second phase forms.

In preparing the respective compounds, the several reactant materials are powdered under a protective atmosphere, such as argon or helium, and admixed in the desired mol proportions. The mixture is pressed at a pressure, for example, of up to 10,000 p.s.i., into pellets. The pellets are supported on a refractory, for example, a plate of magnesia or graphite, and disposed in an evacuated chamber of quartz or ceramic, the vacuum being below 0.1 mm. of mercury, and fired above 500° C., but below the decomposition temperature of the compounds, i.e. not above about 850° C. for the selenides. A suitable firing schedule is 550° C. for 12 hours and then at 650° C. for 24 hours. This produces a single phase solid material having rock salt crystal structure where *m* does not exceed 0.11 for the selenide.

In preparing the fired pellets, it has been discovered that the magnesia support will absorb or react with any second phase $Li_2Se$ that may be present as a liquid during the higher firing temperatures. Therefore, if there is inadvertently added an excess of the $Li_2Se$ above the amount that forms a single phase product, i.e. beyond the value of $m=0.11$ in the reactant selenide mixture, the magnesia will effectively remove it from the pellet during firing. Consequently magnesia supports are desirable for contact with the pellets.

In a similar way, the sulfide and telluride analogues of the $Li_mMn_{(1-m)}Se$ may be prepared. Lithium telluride ($Li_2Te$) and lithium sulfide ($Li_2S$) may be first prepared by a vapor reaction as indicated for the selenide.

The following example illustrates the practice of the invention.

*Example I*

While lithium selenide may be prepared by several methods known in the art, it has been found that the following method is particularly satisfactory. A quantity of lithium metal is placed in a stainless steel or magnesia boat, and placed within a large vessel of quartz or Vycor glass in which an excess of selenium was disposed in a second boat. The large vessel was sealed, evacuated to 1 micron pressure, and heated to 300° C. whereby selenium vapors were freely evolved. After 24 to 48 hours, all of the lithium had been converted by the selenium vapors into $Li_2Se$. No polyselenides were found. The product is of cream color, and may be either of amorphous or dendritic physical shape. It is extremely reactive with air and must be protected from contact with the atmosphere.

Manganese selenide may be readily prepared from powdered electrolytic manganese, or other pure manganese, and selenium. The powdered manganese and selenium are admixed in equimolor proportions; and pressed into pellets. The pellets are placed in a sealed tube and fired. A suitable firing schedule is 2 hours at 200° C., 2 hours at 300° C. and 12 hours at 550° C. and 24 hours at 650° C.

The manganese selenide pellets are crushed in a protective atmosphere to a fine powder, the desired amount of powdered lithium selenide and selenium is added thereto and the three components admixed. The mixture is handled in a dry box filled with argon, for example, and pelleted at 10,000 p.s.i. into pellets of 0.5 inch diameter. The pellets are placed on a magnesia plate disposed within a vessel of Vycor glass which can be sealed, and filled with argon, for example. The pellets are heated for 12 hours at 550° C. and then for 24 hours at 650° C., which results in a product having the formula $Li_mMn_{(1-m)}Se$. These fired pellets are stable in air. By this procedure several pellets were prepared wherein lithium comprised 0.02, 0.05, 0.08 and 0.1 mole the respective formulae being $Li_{.02}Mn_{.98}Se$; $Li_{0.05}Mn_{.95}Se$; $Li_{0.08}Mn_{.92}Se$ and $Li_{.1}Mn_{.9}Se$.

Figure 2:
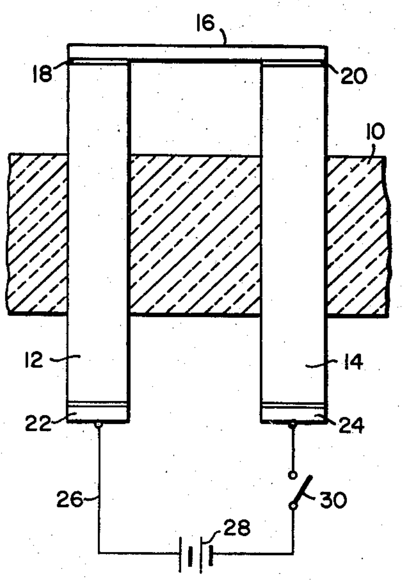

The attached Figure 1 was derived from tests made on a fired pellet prepared as in Example I of the compound $Li_{.03}Mn_{.97}Se$. The thermal conductivity, electrical resistivity and Seebeck coefficient were evaluated at temperatures of up to 825° C., and the curves A, B, and C were plotted from data obtained in tests. Tabulations from these test values were then employed for determining the index of efficiency and figure of merit of this compound and plotted as curves D and E in Figures 1. Extra polation of curve D indicates that the index of efficiency at 1000° C. will attain a value of 15%.

Suitable negative members for a thermoelement pair to associate with the $Li_mMn_{(1-m)}Se$, as well as the corresponding sulfides and tellurides, are stoichiometric compounds of groups III and V of the periodic table—for example, indium arsenide.

A positive thermoelement member may be prepared by admixing finely divided copper oxide and zinc oxide in proportions providing 0.92 mol of zinc oxide and 0.07 mol of copper oxide, and 0.01 mol of lithium peroxide is added ot this mixture. A pellet formed by compressing the mixture is placed within a sealed container of platinum and then hetated at an elevated temperature of, for example, 900° C. for a period of several hours until a homogeneous reaction product is produced. The reaction product is in the form of a sintered pellet, which is inhomogeneous in density and has a relatively high internal resistance and consequently is not suitable for the purpose of producing satisfactory thermoelectric devices. This sintered pellet, therefore, is fused at an elevated temperature and recrystallized into a solid homogeneous body, preferably a single crystal, by withdrawing it at a slow rate from the furnace whereby during cooling controlled solidification results. Single crystals will have a resistivity of the order of 0.01 ohm-cm. The thermal conductivity of the sintered pellet is not significantly different from the thermal conductivity of the single crystal or other solid homogeneous body. Consequently, the formation of a recrystallized or single crystal body results in a marked reduction of the factor $pK$. The resulting single crystal may be cut to produce a suitably shaped positive thermoelement member.

For a negative thermoelement member an alloy is prepared from aluminum and copper in an amount equal to less than 10 atom percent of the aluminum. The alloy may be in the form of thin sheets, powder, wire or the like. The alloy is then heated in an oxidizing atmosphere under conditions wherein oxidation proceeds very slowly. To this end the atmosphere may comprise a very low partial pressure of oxygen of the order of one micron or less, and the temperatures should be relatively low, for example, below 500° C. After several hours of oxidation under these conditions the oxygen partial pressure may be increased and the temperature raised whereby the entire aluminum-copper alloy is rapidly completely oxidized. Thereafter the resulting mixed oxide is crushed to a fine powder and sufficient zinc oxide added thereto to provide 1 to 10 mol percent of zinc oxide and from 0.1 to 10 mol percent of the aluminum, and not less than 80 mol percent of copper. This mixture of oxides is then melted and solidified to form a solid homogeneous member.

Referring to the figure of the drawing, there is illustrated a thermoelectric device suitable for effecting refrigeration. A thermally insulating wall 10 so formed as to provide a suitable chamber, is perforated to permit passage therethrough of a positive thermoelement member 12 and a negative thermoelement member 14. An electrically conducting strip 16 of metal, for example, is joined to an end face 18 of the member 12 and end face 20 of the member 14 within the chamber so as to provide good electrical and thermal contact therewith. The end faces 18 and 20 may be coated with a thin layer of metal, for example, by vacuum evaporation or by use of ultrasonic brazing, whereby good electrical contact and thermal adherence thereto is obtained. The metal strip 16 of copper, silver or the like may be brazed or soldered to the metal coated end faces 18 and 20. The metal strip 16 may be provided with suitable fins or other means for conducting heat thereto from the chamber in which it is disposed. At the end of the member 12 located on the other side of wall 10 is attached a metal plate or strip 22 by brazing or soldering in the same manner as was employed in attaching strip 16 to end face 18. Similarly a metal strip or plate 24 may be connected to the other end of member 14. The plates 22 and 24 may be provided with heat dissipating fins or other cooling means whereby heat generated thereat may be dissipated. An electrical conductor 26 attached to a source 28 of direct current is affixed to the end plates 22 and 24. A switch 30 is interposed in the conductor 26 to enable the electrical circuit to be opened and closed as desired. When the switch 30 is moved to closed position, electrical current from the source 28 flows through the thermoelements 12 and 14 whereby cooling is effected within the metal strip 16 and heat is generated at plates 22 and 24.

It will be appreciated that a plurality of pairs of the positive and negative members may be joined in series in order to produce a plurality of cooperating thermoelements. The cold junctions of each of these joined thermoelements will be placed within a suitable chamber to be cooled while the hot junctions will be so disposed that they will reject heat to a suitable heat sink.

In a similar manner the thermoelements of the present invention may be disposed with one junction in a furnace or other source of heat while the other junction is cooled by applying water or blowing air thereon or the like. Due to the relative difference in the temperature of the junctions, an electrical voltage will be generated in the thermoelements. By joining a plurality of the thermoelements, direct current at any suitable voltage will be generated.

It will be appreciated that the above description and drawing are only exemplary and not exhaustive of the invention.

We claim as our invention:

1. A thermoelement device comprising one member of a homogeneous solid having the formula $Li_mT_{(1-m)}X$ where T represents at least one transition metal from the group consisting of manganese, iron, nickel, cobalt, copper and zinc, X represents a chalcogenide from the group consisting of oxygen, sulfur, selenium and tellurium, and $m$ has a value not exceeding about 0.1 and not less than 0.001, and another member comprising a negative thermoelement material electrically connected to one portion of the said one member.

2. A thermoelement device comprising one member of a homogeneous solid having the formula $LiMn_{(1-m)}X$ where X represents a chalcogenide from the group consisting of oxygen, sulfur, selenium and tellurium, and $m$ has a value not exceeding about 0.11 and not less than 0.001, and another member electrically connected to one portion of the said one member, said another member composed of a homogeneous solid comprising a stoichiometric compound of at least one element of group III selected from the group consisting of indium, aluminum and gallium, and at least one element from group V selected from the group consisting of antimony, phosphorus and arsenic.

3. The thermoelement device of claim 2 wherein the said another member comprises indium arsenide.

4. A thermoelement device comprising one member of homogeneous solid lithium manganese sulfide having from about 0.1 to 0.001 mol of lithium, and the other member comprises a negative theremoelement material electrically connected to one portion of the said one member.

5. A thermoelement device comprising one member of homogeneous solid lithium manganese selenide having from about 0.1 to 0.001 mol of lithium, and the other member comprises a negative thermoelement material electrically connected to one portion of the said one member.

6. A thermoelement device comprising one member of homogeneous solid lithium manganese telluride having from about 0.1 to 0.001 mol of lithium, and the other member comprises a negative thermoelement material electrically connected to one portion of the said one member.

References Cited in the file of this patent

UNITED STATES PATENTS

| | | |
|---|---|---|
| 286,288 | Frasch | Oct. 9, 1883 |
| 685,471 | Hermite et al. | Oct. 29, 1901 |
| 775,188 | Lyons et al. | Nov. 15, 1904 |
| 2,232,960 | Milner | Feb. 25, 1941 |
| 2,397,756 | Schwartz | Apr. 2, 1946 |
| 2,602,095 | Faus | July 1, 1952 |
| 2,685,608 | Justi | Aug. 3, 1954 |
| 2,798,989 | Welker | July 9, 1957 |

OTHER REFERENCES

Journal of Applied Physics, vol. 18, No. 6, December 1947, pp. 1124–5.